US010319266B1

(12) United States Patent
Percival et al.

(10) Patent No.: US 10,319,266 B1
(45) Date of Patent: Jun. 11, 2019

(54) DISPLAY PANEL WITH NON-VISIBLE LIGHT DETECTION

(71) Applicant: Facebook Technologies, LLC, Menlo Park, CA (US)

(72) Inventors: Christopher Percival, Blarney (IE); Robin Sharma, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 81 days.

(21) Appl. No.: 15/495,910

(22) Filed: Apr. 24, 2017

(51) Int. Cl.
G09G 3/32 (2016.01)
G09F 9/33 (2006.01)
G02B 27/01 (2006.01)
H01L 25/16 (2006.01)

(52) U.S. Cl.
CPC ............ *G09F 9/33* (2013.01); *G02B 27/0172* (2013.01); *H01L 25/167* (2013.01)

(58) Field of Classification Search
None
See application file for complete search history.

(56) References Cited

U.S. PATENT DOCUMENTS

| 6,104,431 | A * | 8/2000 | Inoue | H04N 5/23293 |
| | | | | 348/207.99 |
| 9,472,734 | B1 * | 10/2016 | Chen | H01L 33/505 |
| 2005/0078104 | A1 * | 4/2005 | Matthies | G02F 1/13336 |
| | | | | 345/204 |
| 2011/0101205 | A1 * | 5/2011 | Tian | H04N 5/332 |
| | | | | 250/208.1 |
| 2013/0128364 | A1 * | 5/2013 | Wheeler | A61B 3/113 |
| | | | | 359/630 |
| 2013/0207964 | A1 * | 8/2013 | Fleck | H01L 33/60 |
| | | | | 345/419 |
| 2014/0340390 | A1 * | 11/2014 | Lanman | G06T 15/04 |
| | | | | 345/419 |
| 2015/0097756 | A1 * | 4/2015 | Ziarati | G02B 27/0172 |
| | | | | 345/1.3 |
| 2015/0230772 | A1 * | 8/2015 | Yamazaki | A61B 6/5205 |
| | | | | 378/4 |
| 2015/0325746 | A1 * | 11/2015 | Percival | H01L 27/156 |
| | | | | 257/76 |

(Continued)

FOREIGN PATENT DOCUMENTS

JP     2008262204  A  * 10/2008
JP     2008262204  A  * 10/2008

*Primary Examiner* — Abdul-Samad A Adediran
*Assistant Examiner* — Kirk W Hermann
(74) *Attorney, Agent, or Firm* — Fenwick & West LLP

(57) ABSTRACT

A display panel for concurrent video output and eye position tracking. The display panel includes a substrate, a plurality of visible light emitting diodes (LEDs) positioned on a side of the substrate, and a plurality of light detectors positioned on the side of the substrate. The visible LEDs transmit quasi-collimated visible light propagating away from the side of the substrate. The light detectors capture invisible light propagating toward the side of the substrate, reflected from an eye of the user. In some embodiments, non-visible LEDs are formed on the side of the substrate. The visible LEDs, light detectors, and non-visible LEDs may be arranged to form pixels of the display panel. The quasi-collimated light emitted from the visible LEDs reduces spread into beam paths of the invisible light between the non-visible LEDs and the light detectors.

19 Claims, 11 Drawing Sheets

(56) References Cited

U.S. PATENT DOCUMENTS

| | | | |
|---|---|---|---|
| 2015/0364107 A1* | 12/2015 | Sakariya | G06F 3/0412 345/174 |
| 2016/0155781 A1* | 6/2016 | Chaji | H01L 27/3218 257/89 |
| 2017/0242161 A1* | 8/2017 | Zhang | G02B 3/0012 |
| 2017/0324917 A1* | 11/2017 | Mlinar | H04N 5/3592 |

* cited by examiner

DISPLAY PANEL WITH NON-VISIBLE LIGHT DETECTION

BACKGROUND

The present disclosure generally relates to user eye tracking display panels, and specifically to display panels for head-mounted displays (HMDs) that render gaze contingent content.

HMDs generate displays that depend on user motion. For example, a scene presented by a display of an HMD may move with detected changes in the user's eye position to create an immersive virtual environment. It is desirable to detect the direction of a user's gaze, which may comprise detecting the position (or angular orientation) of the user's eyes, while simultaneously rendering gaze contingent content.

SUMMARY

Embodiments relate to a display panel that concurrently outputs video of visible light and perform user eye tracking using invisible (or "non-visible") light. The display panel includes a substrate, a plurality of visible light emitting diodes (LEDs) positioned on a side of the substrate, and a plurality of light detectors positioned on the side of the substrate. The visible LEDs transmit quasi-collimated visible light propagating away from the side of the substrate. The light detectors are configured to capture invisible light propagating towards the side of the substrate. The quasi-collimated light emitted from the visible LEDs prevent optical interference with beam paths of the invisible light captured by the light detectors, thereby allowing for concurrent video output and eye position tracking.

In some embodiments, each of the visible LEDs includes an active layer for generating the visible light and an epitaxial layer shaped into a mesa to reflect and collimate a portion of the visible light.

In some embodiments, the display panel includes a plurality of non-visible LEDs positioned on the side of the substrate that emit invisible light propagating away from the side of the substrate. The invisible light emitted from the non-visible LEDs may be reflected off an eye of a viewer, and transmitted back toward the first surface for capture by the plurality of light detectors. The quasi-collimated light emitted from the visible LEDs prevents optical interference with beam paths of the invisible light between the non-visible LEDs and the light detectors.

Some embodiments may include a method for video output using visible light and user eye tracking using invisible light. The method may include: emitting, by a plurality of visible light emitting diodes (LEDs) positioned on a side of a substrate of a display panel, quasi-collimated visible light in a first direction away from the side of the substrate; emitting, by a plurality of non-visible LEDs, invisible light in a first direction away from the side of the substrate, the invisible light emitted with the emission of the quasi-collimated visible light by the plurality of visible light LEDs; capturing a portion of the invisible light reflected from eyes of a user and propagating in a second direction toward a plurality of light detectors on the side of the substrate; and determining an accommodation state of the eyes of the user based on captured invisible light.

In some embodiments, the method may further include: rendering gaze contingent content based on the accommodation state; and emitting second quasi-collimated visible light from the plurality of visible light emitting diodes (LEDs) to output the gaze contingent content.

Some embodiments include a head-mounted display (HMD) for concurrent video output with visible light and user eye tracking with invisible light. The HMD includes a display panel including a substrate, a plurality of visible LEDs, and a plurality of light detectors. In some embodiments, the display panel includes a plurality of non-visible LEDs.

The figures depict embodiments of the present disclosure for purposes of illustration only.

DETAILED DESCRIPTION

Embodiments relate to electronic displays capable of providing (e.g., concurrent) video output and eye position tracking. An electronic display may include a display panel having a substrate and a pixel layer of pixels formed on the substrate. A pixel includes sub-pixel components such as visible light emitting diodes (LEDs) that emit visible color light to produce the video output as well as sub-pixels for emitting and capturing non-visible (e.g., infrared) light for eye position tracking and a light detector sub-pixel for detecting the invisible light. The quasi-collimated light emitted from the visible LEDs prevents optical interference with beam paths of the invisible light between the non-visible LEDs and the light detectors. The visible LEDs may be positioned in close proximity to the non-visible light sub-pixel components between the non-visible LEDs and the light detectors because the quasi-collimated light emitted from the visible LEDs have reduce spread.

System Overview

Figure 1:
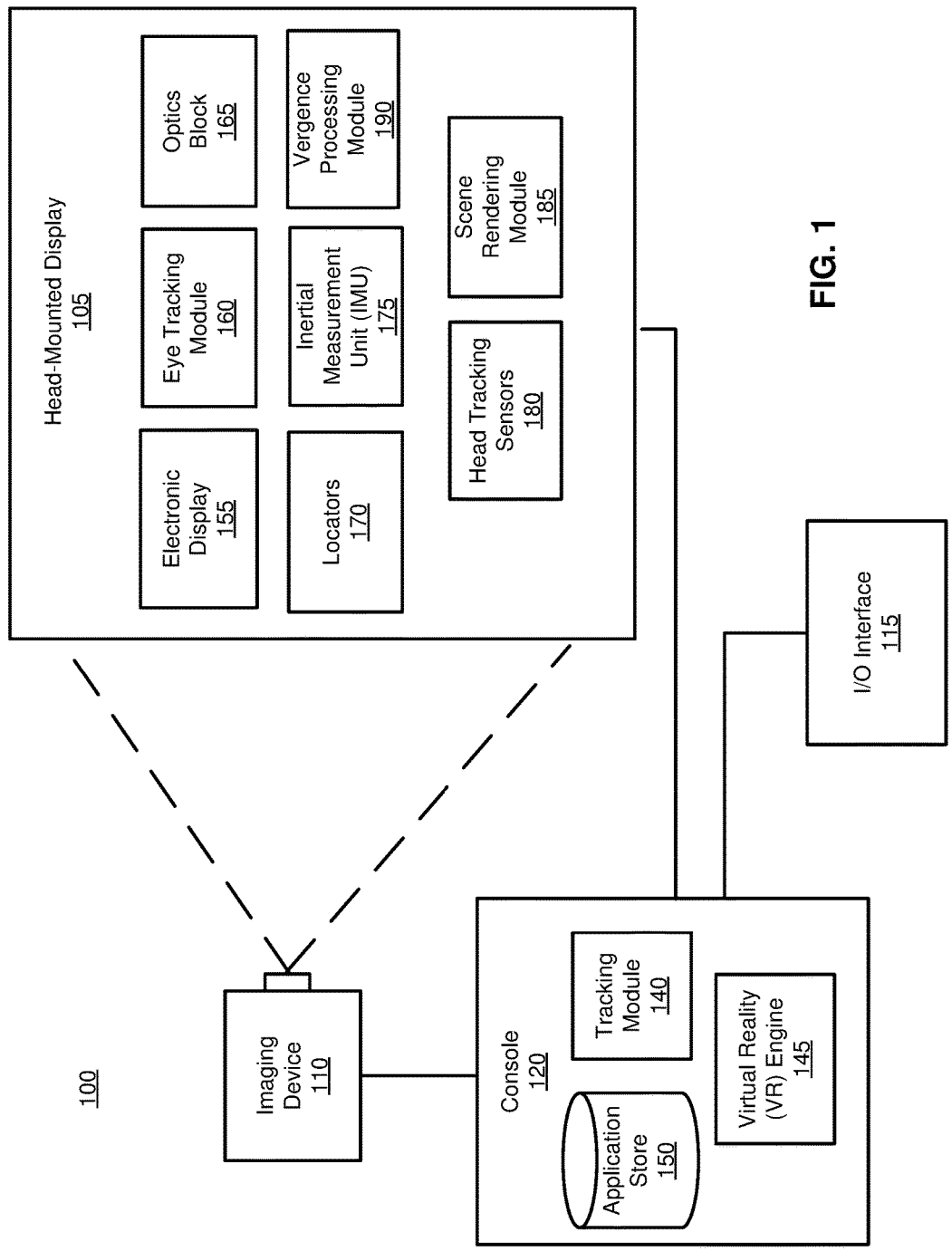
FIG. 1 is a block diagram illustrating a system associated with a head-mounted display (HMD), in accordance with one embodiment.

FIG. 1 is a block diagram illustrating a system 100 including a head-mounted display (HMD), according to one embodiment. The system 100 may be used in a virtual reality (VR) system, an augmented reality (AR) system, a mixed reality (MR) system, or some combination thereof. In this example, the system 100 includes a HMD 105, an imaging device 110, and an input/output (I/O) interface 115, which are each coupled to a console 120. While FIG. 1 shows a single HMD 105, a single imaging device 110, and an I/O interface 115, in other embodiments, any number of these components may be included in the system. For example, there may be multiple HMDs 105 each having an associated input interface 115 and being monitored by one or more imaging devices 110, with each HMD 105, I/O interface 115, and imaging devices 110 communicating with the console 120. In alternative configurations, different and/or additional components may also be included in the system 100. The HMD 105 may act as a VR, AR, and/or a MR HMD. An MR and/or AR HMD augments views of a physical, real-world environment with computer-generated elements (e.g., images, video, sound, etc.).

The HMD 105 presents content to a user. Example content includes images, video, audio, or some combination thereof. Audio content may be presented via a separate device (e.g., speakers and/or headphones) external to the HMD 105 that receives audio information from the HMD 105, the console 120, or both. The HMD 105 includes an electronic display 155, an eye tracking module 160, an optics block 165, one or more locators 170, an internal measurement unit (IMU) 175, head tracking sensors 180, and a scene rendering module 185, and a vergence processing module 190.

As discussed in further detail below, the electronic display 155 provides a display of gaze contingent content concurrent with eye position detection. The detection of eye tracking information is used as an input to generate (e.g., a subsequent video frame) of gaze contingent content. The electronic display 155 includes a display panel having a substrate, and visible LEDs and light detectors positioned on a surface of the substrate.

The optics block 165 adjusts its focal length responsive to instructions from the console 120. In some embodiments, the optics block 165 includes a multifocal block to adjust a focal length (adjusts optical power) of the optics block 165.

The eye tracking module 160 tracks an eye position and eye movement of a user of the HMD 105. The light detectors of the electronic display 155 (e.g., or elsewhere in the HMD 105) capture image information of a user's eyes, and the eye tracking module 160 uses the captured information to determine eye tracking information such as interpupillary distance, interocular distance, a three-dimensional (3D) position of each eye relative to the HMD 105 (e.g., for distortion adjustment purposes), including a magnitude of torsion and rotation (i.e., roll, pitch, and yaw) and gaze directions for each eye. The information for the position and orientation of the user's eyes is used to determine the gaze point in a virtual scene presented by the HMD 105 where the user is looking.

The vergence processing module 190 determines a vergence depth of a user's gaze based on the gaze point or an estimated intersection of the gaze lines determined by the eye tracking module 160. Vergence is the simultaneous movement or rotation of both eyes in opposite directions to maintain single binocular vision, which is naturally and automatically performed by the human eye. Thus, a location where a user's eyes are verged is where the user is looking and is also typically the location where the user's eyes are focused. For example, the vergence processing module 190 triangulates the gaze lines to estimate a distance or depth from the user associated with intersection of the gaze lines. The depth associated with intersection of the gaze lines can then be used as an approximation for the accommodation distance, which identifies a distance from the user where the user's eyes are directed. Thus, the vergence distance allows determination of a location where the user's eyes should be focused.

The locators 170 are objects located in specific positions on the HMD 105 relative to one another and relative to a specific reference point on the HMD 105. A locator 170 may be a light emitting diode (LED), a corner cube reflector, a reflective marker, a type of light source that contrasts with an environment in which the HMD 105 operates, or some combination thereof. Active locators 170 (i.e., an LED or other type of light emitting device) may emit light in the visible band (~380 nm to 850 nm), in the infrared (IR) band (~850 nm to 1 mm), in the ultraviolet band (10 nm to 380 nm), some other portion of the electromagnetic spectrum, or some combination thereof.

The locators 170 can be located beneath an outer surface of the HMD 105, which is transparent to the wavelengths of light emitted or reflected by the locators 170 or is thin enough not to substantially attenuate the wavelengths of light emitted or reflected by the locators 170. Further, the outer surface or other portions of the HMD 105 can be opaque in the visible band of wavelengths of light. Thus, the locators 170 may emit light in the IR band while under an outer surface of the HMD 105 that is transparent in the IR band but opaque in the visible band.

The IMU 175 is an electronic device that generates fast calibration data based on measurement signals received from one or more of the head tracking sensors 180, which generate one or more measurement signals in response to motion of HMD 105. Examples of the head tracking sensors 180 include accelerometers, gyroscopes, magnetometers, other sensors suitable for detecting motion, correcting error associated with the IMU 175, or some combination thereof. The head tracking sensors 180 may be located external to the IMU 175, internal to the IMU 175, or some combination thereof.

Based on the measurement signals from the head tracking sensors 180, the IMU 175 generates fast calibration data indicating an estimated position of the HMD 105 relative to an initial position of the HMD 105. For example, the head tracking sensors 180 include multiple accelerometers to measure translational motion (forward/back, up/down, left/right) and multiple gyroscopes to measure rotational motion (e.g., pitch, yaw, and roll). The IMU 175 can, for example, rapidly sample the measurement signals and calculate the estimated position of the HMD 105 from the sampled data. For example, the IMU 175 integrates measurement signals received from the accelerometers over time to estimate a velocity vector and integrates the velocity vector over time to determine an estimated position of a reference point on the HMD 105. The reference point is a point that may be used to describe the position of the HMD 105. While the reference point may generally be defined as a point in space, in various embodiments, a reference point is defined as a point within the HMD 105 (e.g., a center of the IMU 175). Alternatively, the IMU 175 provides the sampled measurement signals to the console 120, which determines the fast calibration data.

The IMU 175 can additionally receive one or more calibration parameters from the console 120. As further discussed below, the one or more calibration parameters are used to maintain tracking of the HMD 105. Based on a received calibration parameter, the IMU 175 may adjust one or more of the IMU parameters (e.g., sample rate). In some embodiments, certain calibration parameters cause the IMU 175 to update an initial position of the reference point to correspond to a next calibrated position of the reference point. Updating the initial position of the reference point as the next calibrated position of the reference point helps reduce accumulated error associated with determining the estimated position. The accumulated error, also referred to as drift error, causes the estimated position of the reference point to "drift" away from the actual position of the reference point over time.

The scene rendering module 185 receives content for the virtual scene from a VR engine 145 and provides the content for display on the electronic display 155. Additionally, the scene rendering module 185 can adjust the content based on information from the IMU 175, the vergence processing module 190, and the head tracking sensors 180. The scene rendering module 185 determines a portion of the content to be displayed on the electronic display 155 based on one or more of the tracking module 140, the head tracking sensors 180, or the IMU 175.

The imaging device 110 generates slow calibration data in accordance with calibration parameters received from the console 120. Slow calibration data includes one or more images showing observed positions of the locators 125 that are detectable by imaging device 110. The imaging device 110 may include one or more cameras, one or more video cameras, other devices capable of capturing images including one or more locators 170, or some combination thereof. Additionally, the imaging device 110 may include one or more filters (e.g., for increasing signal to noise ratio). The imaging device 110 is configured to detect light emitted or reflected from the locators 170 in a field of view of the imaging device 110. In embodiments where the locators 170 include passive elements (e.g., a retroreflector), the imaging device 110 may include a light source that illuminates some or all of the locators 170, which retro-reflect the light towards the light source in the imaging device 110. Slow calibration data is communicated from the imaging device 110 to the console 120, and the imaging device 110 receives one or more calibration parameters from the console 120 to adjust one or more imaging parameters (e.g., focal length, focus, frame rate, ISO, sensor temperature, shutter speed, aperture, etc.).

The I/O interface 115 is a device that allows a user to send action requests to the console 120. An action request is a request to perform a particular action. For example, an action request may be to start or end an application or to perform a particular action within the application. The I/O interface 115 may include one or more input devices. Example input devices include a keyboard, a mouse, a hand-held controller, a glove controller, or any other suitable device for receiving action requests and communicating the received action requests to the console 120. An action request received by the I/O interface 115 is communicated to the console 120, which performs an action corresponding to the action request. In some embodiments, the I/O interface 115 may provide haptic feedback to the user in accordance with instructions received from the console 120. For example, haptic feedback is provided by the I/O interface 115 when an action request is received, or the console 120 communicates instructions to the I/O interface 115 causing the I/O interface 115 to generate haptic feedback when the console 120 performs an action.

The console 120 provides content to the HMD 105 for presentation to the user in accordance with information received from the imaging device 110, the HMD 105, or the I/O interface 115. The console 120 includes an application store 150, a tracking module 140, and the VR engine 145. Some embodiments of the console 120 have different or additional modules than those described in conjunction with FIG. 1. Similarly, the functions further described below may be distributed among components of the console 120 in a different manner than is described here.

The application store 150 stores one or more applications for execution by the console 120. An application is a group of instructions, that when executed by a processor, generates content for presentation to the user. Content generated by an application may be in response to inputs received from the user via movement of the HMD 105 or the I/O interface 115. Examples of applications include gaming applications, conferencing applications, video playback application, or other suitable applications.

The tracking module 140 calibrates the system 100 using one or more calibration parameters and may adjust one or more calibration parameters to reduce error in determining position of the HMD 105. For example, the tracking module 140 adjusts the focus of the imaging device 110 to obtain a more accurate position for observed locators 170 on the HMD 105. Moreover, calibration performed by the tracking module 140 also accounts for information received from the IMU 175. Additionally, if tracking of the HMD 105 is lost (e.g., imaging device 110 loses line of sight of at least a threshold number of locators 170), the tracking module 140 re-calibrates some or all of the system 100 components.

Additionally, the tracking module 140 tracks the movement of the HMD 105 using slow calibration information from the imaging device 110 and determines positions of a reference point on the HMD 105 using observed locators from the slow calibration information and a model of the HMD 105. The tracking module 140 also determines positions of the reference point on the HMD 105 using position information from the fast calibration information from the IMU 175 on the HMD 105. Additionally, the tracking module 160 may use portions of the fast calibration information, the slow calibration information, or some combination thereof, to predict a future location of the HMD 105, which is provided to the VR engine 145.

The VR engine 145 executes applications within the system 100 and receives position information, acceleration information, velocity information, predicted future positions, or some combination thereof for the HMD 105 from the tracking module 140. Based on the received information, the VR engine 145 determines content to provide to the HMD 105 for presentation to the user, such as a virtual scene, one or more virtual objects to overlay onto a real world scene, etc.

In some embodiments, the VR engine 145 maintains focal capability information of the optics block 165. Focal capability information is information that describes what focal distances are available to the optics block 165. Focal capability information may include, e.g., a range of focus the optics block 165 is able to accommodate (e.g., 0 to 4 diopters), a resolution of focus (e.g., 0.25 diopters), a number of focal planes, combinations of settings for switchable half wave plates (SHWPs) (e.g., active or non-active) that map to particular focal planes, combinations of settings for SHWPS and active liquid crystal lenses that map to particular focal planes, or some combination thereof.

The VR engine 145 generates instructions for the optics block 165, the instructions causing the optics block 165 to adjust its focal distance to a particular location. The VR engine 145 generates the instructions based on focal capability information and, e.g., information from the vergence processing module 190, the IMU 175, and the head tracking sensors 180. The VR engine 145 uses the information from the vergence processing module 190, the IMU 175, and the head tracking sensors 180, or some combination thereof, to select an ideal focal plane to present content to the user. The VR engine 145 then uses the focal capability information to select a focal plane that is closest to the ideal focal plane. The VR engine 145 uses the focal information to determine settings for one or more SHWPs, one or more active liquid crystal lenses, or some combination thereof, within the optics block 176 that are associated with the selected focal plane. The VR engine 145 generates instructions based on the determined settings, and provides the instructions to the optics block 165.

The VR engine 145 performs an action within an application executing on the console 120 in response to an action request received from the I/O interface 115 and provides feedback to the user that the action was performed. The provided feedback may be visual or audible feedback via the HMD 105 or haptic feedback via the I/O interface 115.

Figure 2:
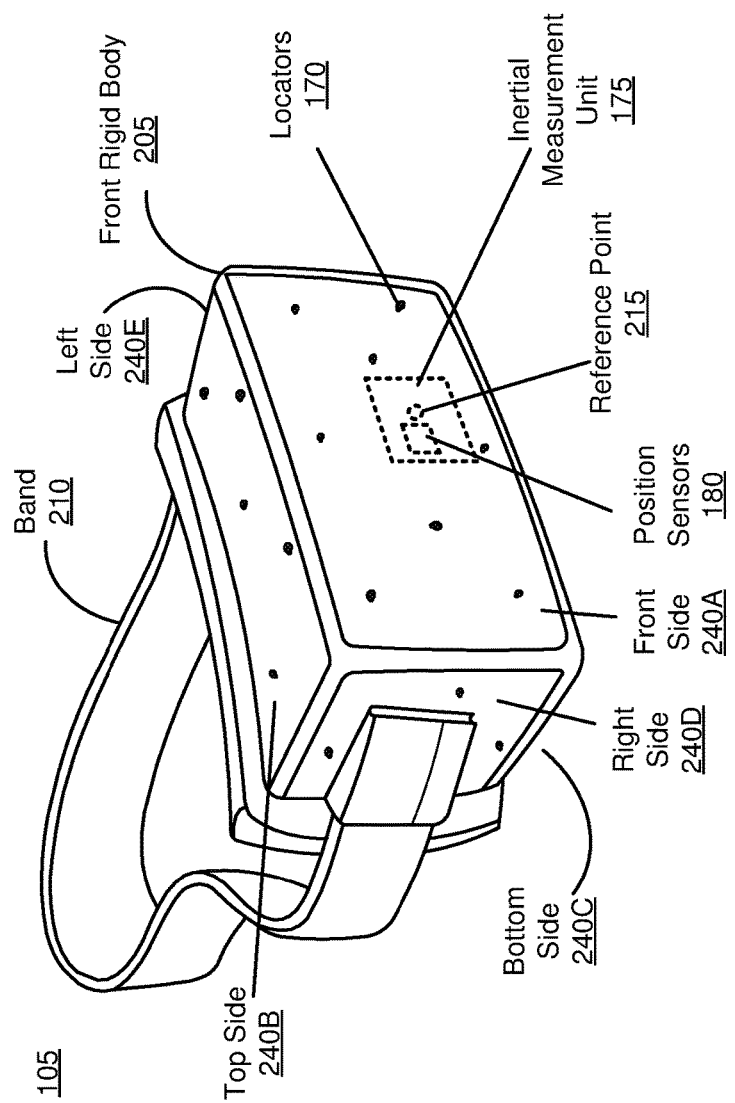
FIG. 2 is a perspective view of the HMD of FIG. 1, in accordance with one embodiment.

FIG. 2 shows a head-mounted display (HMD) 105, in accordance with one embodiment. The HMD 105 includes a front rigid body 205 and a band 210. The front rigid body 205 includes an electronic display (not shown), an inertial measurement unit (IMU) 175, one or more position sensors 180, and locators 170. In some embodiments, a user movement is detected by use of the inertial measurement unit 175, position sensors 180, and/or the locators 170, and an image is presented to a user through the electronic display according to the user movement detected. In some embodiments, the HMD 105 can be used for presenting a virtual reality, an augmented reality, or a mixed reality to a user.

A position sensor 180 generates one or more measurement signals in response to motion of the HMD 105. Examples of position sensors 180 include: one or more accelerometers, one or more gyroscopes, one or more magnetometers, another suitable type of sensor that detects motion, a type of sensor used for error correction of the IMU 175, or some combination thereof. The position sensors 180 may be located external to the IMU 175, internal to the IMU 175, or some combination thereof. In FIG. 2, the position sensors 180 are located within the IMU 175, and neither the IMU 175 nor the position sensors 180 are visible to the user.

Based on the one or more measurement signals from one or more position sensors 180, the IMU 175 generates calibration data indicating an estimated position of the HMD 105 relative to an initial position of the HMD 105. In some embodiments, the IMU 175 rapidly samples the measurement signals and calculates the estimated position of the HMD 100 from the sampled data. For example, the IMU 175 integrates the measurement signals received from the accelerometers over time to estimate a velocity vector and integrates the velocity vector over time to determine an estimated position of a reference point on the HMD 105. Alternatively, the IMU 17 provides the sampled measurement signals to a console (e.g., a computer), which determines the calibration data. The reference point is a point that may be used to describe the position of the HMD 105. While the reference point may generally be defined as a point in space; however, in practice the reference point is defined as a point within the HMD 105 (e.g., a center of the IMU 175).

The locators 170 are located in fixed positions on the front rigid body 205 relative to one another and relative to a reference point 215. In FIG. 2, the reference point 215 is located at the center of the IMU 175. Each of the locators 170 emits light that is detectable by an imaging device (e.g., camera or an image sensor). Locators 170, or portions of locators 170, are located on a front side 240A, a top side 240B, a bottom side 240C, a right side 240D, and a left side 240E of the front rigid body 205 in the example of FIG. 2.

Figure 3:
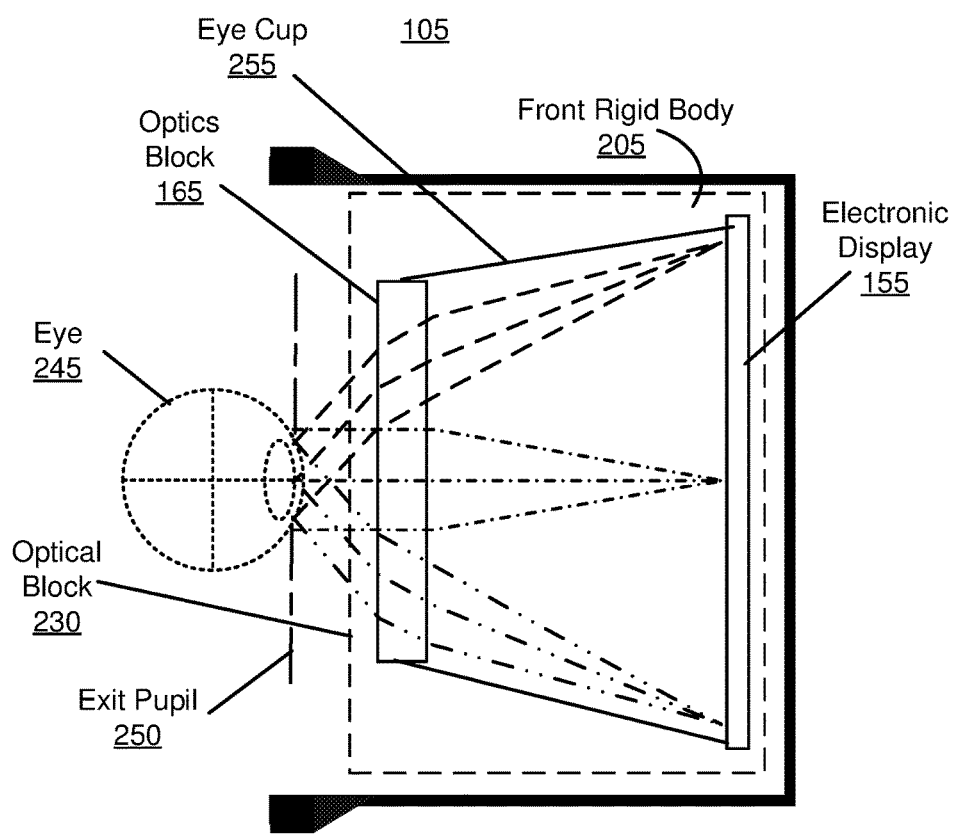
FIG. 3 is a cross sectional diagram illustrating a front rigid body of the HMD in FIG. 2, in accordance with one embodiment.

FIG. 3 is a cross sectional diagram illustrating the front rigid body 205 of the HMD 105 shown in FIG. 2. The front rigid body 205 includes an optical block 230 that provides altered image light to an exit pupil 250. The exit pupil 250 is the location in the front rigid body 205 where a user's eye 245 is positioned. For purposes of illustration, FIG. 3 shows a cross section associated with a single eye 245, but the HMD 105 may include another optical block that provides altered image light to another eye of the user.

The optical block 230 may include, among other components, the electronic display 155, the optics block 165, and an eye cup 255. The eye cup 255 is mechanically secured with the front rigid body 205, and holds the optics block 165. The electronic display 155 emits visible light toward the optics block 165. The optics block 165 is a combination of components for directing the visible light and invisible light to the exit pupil 250 for presentation to the user. The optics block 165 can magnify the visible light, and in some embodiments, also corrects for one or more additional optical errors (e.g., distortion, astigmatism, etc.). In some embodiments, the optics block 165 and the eye cup 255 may be omitted from the optical block 230. In some embodiments, one or more optical components of the optics block 165 may include an anti-reflection coating.

The visible light is emitted from visible light sources (e.g., LEDs) of the electronic display 155 and passed through the optics block 165 to reach the eye 245 of the viewer. The invisible light is emitted from non-visible LEDs or other non-visible light emitters (e.g., infrared emitters) of the electronic display 155, transmitted through the optics block 165, reflected off the eye 245, and transmitted back through the optics block 165 to propagate to non-visible light detectors of the electronic display 155. The visible light provides video images to the viewer while the non-visible is used for eye position tracking.

Figure 4:
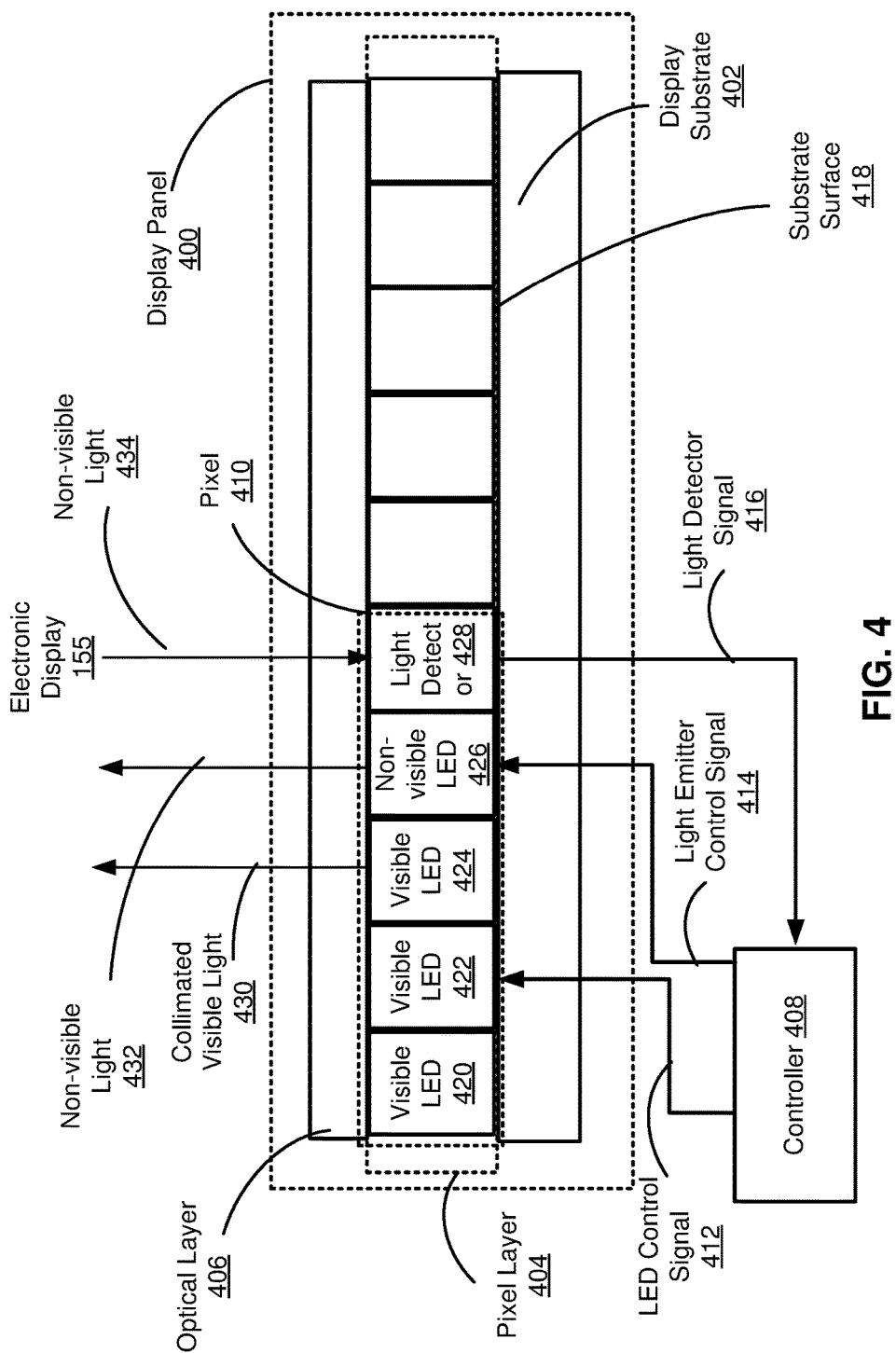
FIG. 4 is a cross sectional diagram of an electronic display in the HMD, in accordance with one embodiment.

FIG. 4 is a cross sectional diagram of an electronic display 155 in the HMD, in accordance with one embodiment. The electronic display 155 provides concurrent gaze contingent content output with visible light and eye position tracking with invisible light. The electronic display 155 includes a display panel 400 and a controller 408. The display panel 400 may include, among other components, a display substrate 402 (or "substrate 402"), a pixel layer 404, and an optical layer 406. The pixel layer 404 includes an array of pixels 410 that are positioned on the surface 418 of the display substrate 402. The pixels 410 of the pixel layer 404 emit light to provide images to the viewer. The display substrate 402 provides structural support for various components (e.g., pixels and data/gate lines. The display substrate 402 may also provide electrical connections between the sub-pixel components of the pixels 410 and the controller 408. The display substrate 402 may be flexible substrate such as polymer or a rigid substrate such as a Thin Film Transistor (TFT) glass substrate.

The pixel layer 404 may include, among other components, the sub-pixel components of the pixels 410. For example, a pixel 410 may include one or more visible LEDs (such as visible LEDs 420, 422, and 424), a non-visible LED 426, and a light detector 428. The sub-pixel components are positioned on the display substrate 402 adjacent to each other to form a matrix of pixels 410. The visible LEDs 420 through 424 emit color light, such as collimated visible light 430, propagating away from the surface 418 of the substrate 402. In some embodiments, each pixel 410 includes multiple visible LEDs, such as one or more red LEDs, one or more green LEDs, and one or more blue LEDs.

The non-visible LED 426 emits invisible light 432. The invisible light 432 has a beam path that include propagation away from the surface 418 of the substrate 402 toward the eyes of the viewer of the electronic display 155, and reflection from eyes toward the light detector 428 as invisible light 434. The light detector 428 receives and captures the reflected invisible light 434. Different features of the eye reflect the invisible light differently, and thus the captured invisible light can be processed for eye position tracking.

In some embodiments, the visible LEDs 420 through 424 emit collimated light 430. The collimated light 430 results in a reduction of visible light beam width spread into the beam path of the nonvisible light 432 and 434. Advantageously, the visible light 430 from the visible LEDs does not cause optical interference that would preclude the effective capture of the invisible light 434 by the light detector 428, as described below in detail with reference to FIG. 5. Furthermore, the visible LEDs 420, 422, or 424 of a pixel 410 can emit the collimated visible light 430 concurrently with the non-visible LED 426 emitting the invisible light 432 to provide concurrent eye tracking and gaze contingent content rendering by the electronic display 155, and concurrently with the light detector 428 receiving the invisible light 434. The collimated shape of the visible light 430 allows for sub-pixel components that handle visible light and sub-pixel components that handle invisible light to be within sub-pixel proximity within the space of a pixel of the display panel 400. For example, the sub-pixel components may have a diameter of between 2.5 to 7 µm, and may be separated by between a 5 to 10 µm pitch. Pixel size and pitch can depend on the number, size, and pitch of the sub-pixels. In one example, the pixel pitch is approximately 20 µm.

The light detector 428 is a component formed on the display substrate 402 for detecting the invisible light reflected from the user's eye. In some embodiments, the light detector 428 may include a structure similar to the visible LEDs and the non-visible LEDs except that rather than a mesa structure that collimates lights (e.g., as discussed in greater detail below in connection with FIG. 5), the light detector 428 has a large active area for light capture. In some embodiments, the light detector 428 is larger than the visible and non-visible LEDs to provide, among other things, the large active area for light capture. An example of a display panel having larger light detectors 428 than visible and non-visible LEDs is discussed in greater detail below in connection with FIG. 11.

A pixel 410 may include one or more color LEDs of different color. For example, a pixel 410 can include multiple LEDs of a particular color to provide a uniform light intensity for each color of light emitted from the pixel 410. The collimated beam of visible light 430 emitted from the visible LEDs 420 does not expand into the input regions of nearby light detectors 428. This prevents the visible light from saturating or otherwise interfering with the capture of invisible light 434 by the light detectors 428. In some embodiments, non-visible LEDs 426 are placed adjacent to light detectors 428 within a pixel to decrease the occurrence of visible light interference in the invisible light beam path (e.g., including invisible light 432 and 434).

Figure 11:
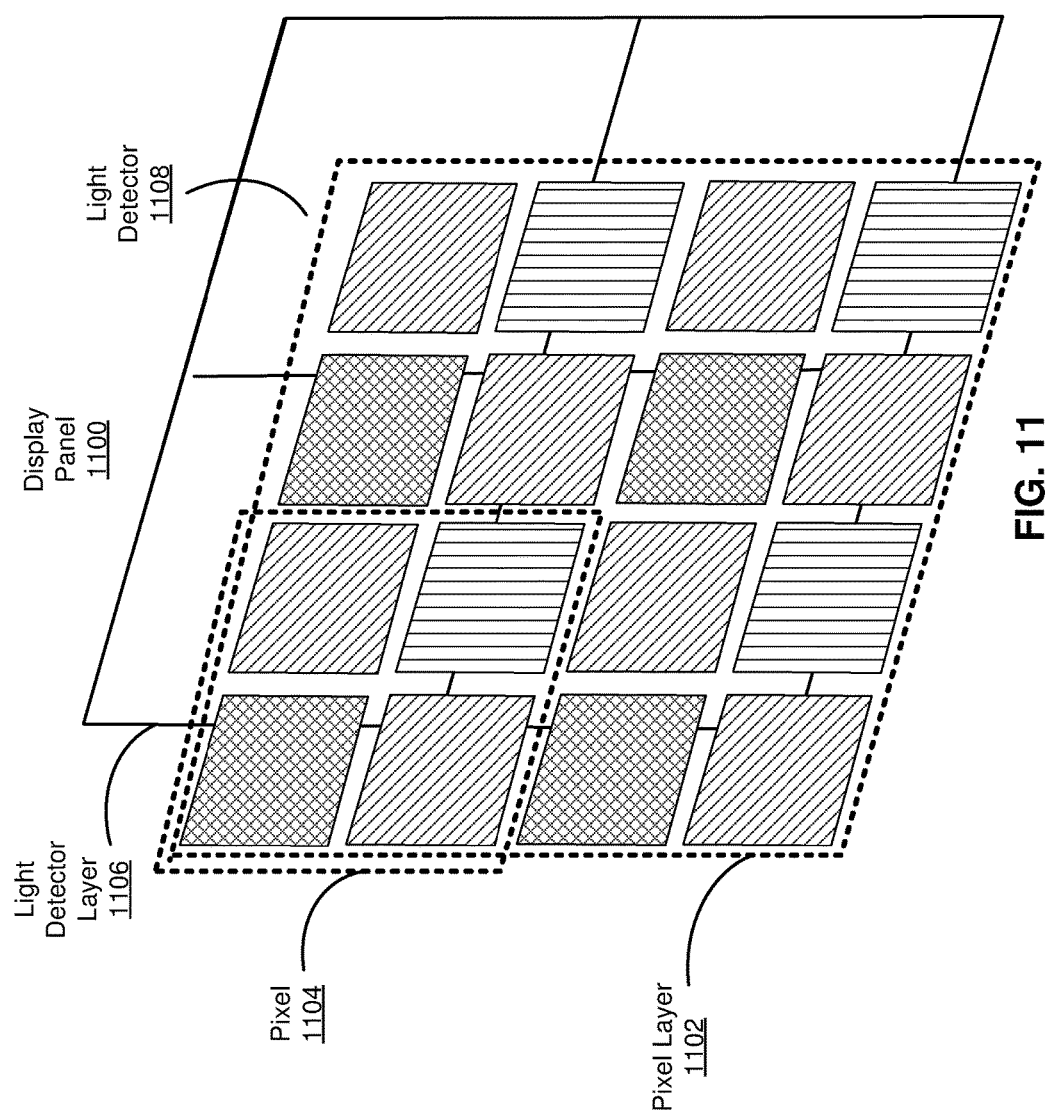
FIG. 11 is a schematic diagram illustrating a display panel including a pixel layer and a light detector layer, in accordance with one embodiment.

In some embodiments, the non-visible LEDs 426 and/or light detectors 428 are located elsewhere in the HMD 105. For example, the light detectors 428 may be located in a separate layer from the pixel layer 404 (e.g., as shown in FIG. 11), and/or the non-visible LEDs 426 may be located around the periphery of the electronic display 155.

The controller 408 is a circuitry that controls the visible LEDs 420 through 424 via a LED control signal 412, the non-visible LEDs 426 via a light emitter control signal 414, and receives light detector signal 416 representing invisible light captured by the light detector 428. The controller 408 coordinates the operation of the sub-pixel components, such as by providing the LED control signal to control the output collimated visible light 430 for rendering an image, providing the light emitter control signal 414 to control output of the invisible light 432, and receiving invisible light image information captured by the light detector signal 416. The controller can control the visible LEDs 420 to emit visible light and the non-visible LEDs 426 to emit invisible light at the same time. The controller 408 may be connected with the eye tracking module 160 of the HMD 105 to provide the captured image information for determination of eye tracking information. In some embodiments, the eye tracking module 160 is integrated as circuitry with the controller 408.

The sub-pixel components of the pixel layer 404 may be fabricated separately and then bonded to the surface 418 of the display substrate 402. For example, the visible LEDs may be fabricated on a native substrate, singulated, and then transferred to the display substrate 402 to form the pixel layer 404. The visible LEDs may be positioned on the substrate surface 418, and then bonded to form electrical connections with the display substrate 402 (e.g., a TFT layer). Similarly, the non-visible LED 426 and a light detector 428 may also be separately fabricated, and then positioned and bonded onto the display substrate 402 to form electrical connections with the display substrate 402.

In some embodiments, different types of sub-pixel components may be positioned and bonded to the display substrate 402 in separate bonding cycles. In each bonding cycle, a subset of sub-pixel components for multiple pixels may be picked up from a native substrate or intermediate carrier substrate, placed (e.g., in parallel) onto the display substrate 402, and then electrically bonded with the display substrate via electrical contacts. For example, an (e.g., 2 dimensional) array of red LEDs (for multiple pixels) are first positioned and bond on the display substrate 402, and then an array of blue LEDs are positioned and bonded on the display substrate 402, then an array of green LEDs are positioned and bonded on the display substrate 402, then an array of light detectors are positioned and bonded on the display substrate 402, and then an array of non-visible LEDs are positioned and bonded on the display substrate 402. The order of array placement may depend, for example, on relative heights of the sub-pixel components.

The optical layer 406 may be disposed on top of the pixel layer 404. The optical layer 406 may include one or more optical elements that transmit visible and invisible light. The optical layer 406 may include brightness enhancement films (BEFs), diffusers, polarizers, etc. The optical layer 406 can change characteristics of the light passed through the optical layer 406, such as polarization orientation, efficiency of light extraction from the display panel, etc. The optical layer 406 may also provide structural protection for the components of the pixel layer 404.

Although shown as a single layer, a separate optical layer may be applied to individual sub-pixel components. Furthermore, different types of sub-pixel components may include different types of optical layers. For example, the visible LEDs and/or non-visible LED 426 that emit light may include an optical layer that filters for polarization, while the light detector 428 that detects light may include one or more anti-reflective coatings. In some embodiments, the optical layer of the light detectors 428 include polarizers to suppress back reflections and/or notch filters to reduce contamination by light from visible LEDs. In some embodiments, the optical layers on the sub-pixel components cause the polarization of visible and non-visible light to be orthogonal to each other.

Figure 5:
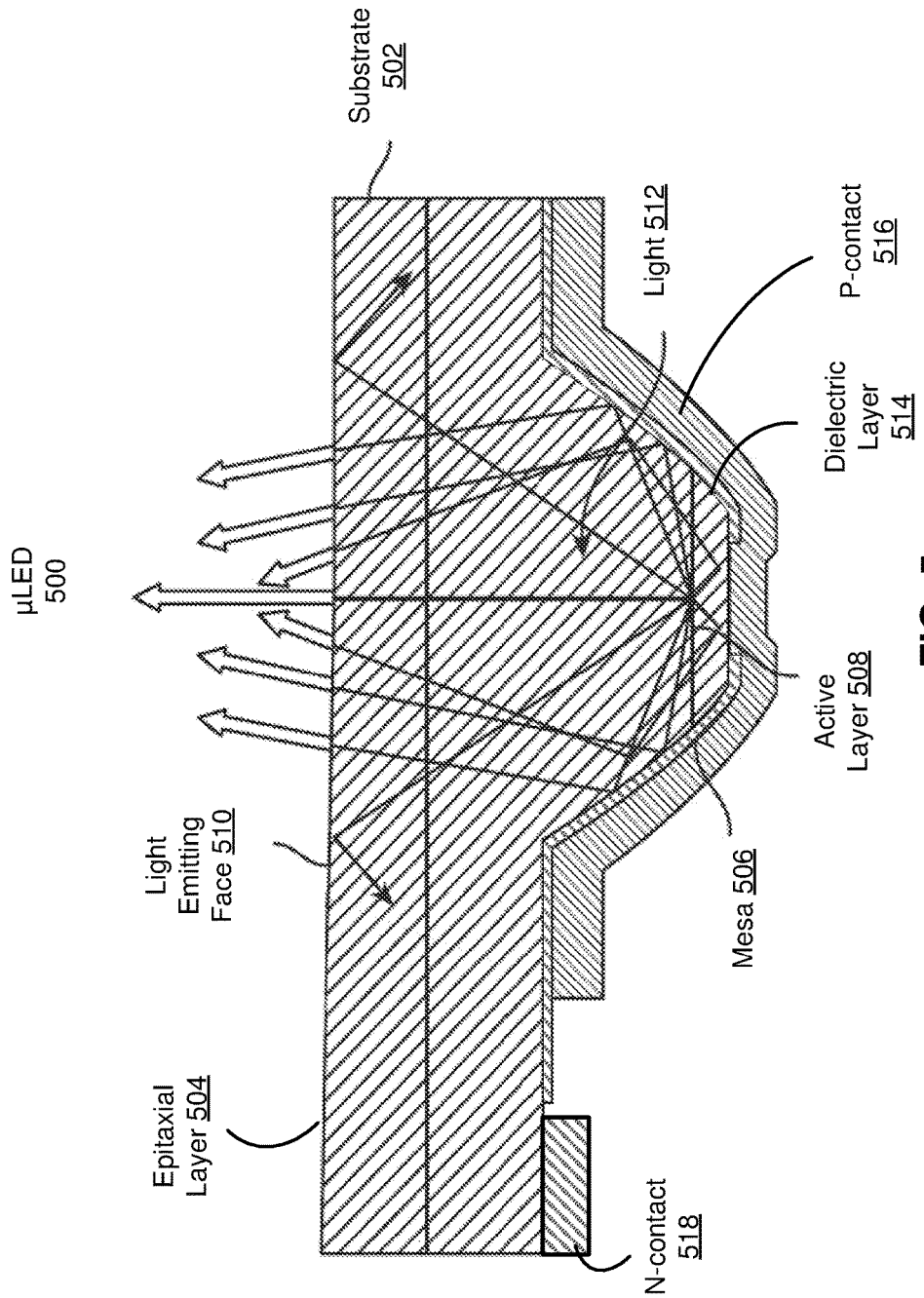
FIG. 5 is a schematic cross section of a μLED in the electronic display of FIG. 4, in accordance with one embodiment.

FIG. 5 shows a schematic cross section of a µµLED 500, in accordance with one embodiment. A "µLED," or "MicroLED," described herein refers to a particular type of LED having a small active light emitting area (e.g., less than 2,000 µm²), and collimated light output. The collimated light output increases the brightness level of light emitted from the small active light emitting area and prevents the spreading of emitted light into the beampath of invisible light used by light detectors and non-visible LEDs adjacent to the µLED. The µLED 500 is an example of a visible or non-visible LED positioned on the surface 418 of the display substrate 402 to emit the collimated visible or invisible light 430.

The µLED 500 may include, among other components, a LED substrate 502 (or "substrate 502") with a semiconductor epitaxial layer 504 disposed on the substrate 502, a dielectric layer 514 disposed on the epitaxial layer 504, a p-contact 516 disposed on the dielectric layer 514, and an n-contact 518 disposed on the epitaxial layer 504. The epitaxial layer 504 is shaped into a mesa 506. An active (or light emitting) layer 508 (or "active light emitting area") is included in the structure of the mesa 506. The mesa 506 has a truncated top, on a side opposed to a light transmitting or emitting face 510 of the µLED 500. The mesa 506 also has a near-parabolic shape to form a reflective enclosure for light generated within the µLED 500. The arrows 512 show how light emitted from the active layer 508 is reflected off the p-contact 516 and internal walls of the mesa 506 toward the light emitting face 510 at an angle sufficient for the light to escape the µLED device 500 (i.e., within an angle of total internal reflection). The p-contact 516 and the n-contact 518 connect the µLED 500 to the display substrate 402.

The parabolic shaped structure of the µLED 500 results in an increase in the extraction efficiency of the µLED 500 into low illumination angles when compared to unshaped or standard LEDs. Standard LED dies generally provide an emission full width half maximum (FWHM) angle of 120°. This is dictated by the Lambertian reflectance from a diffuse surface. In comparison the µLED 500 can be designed to provide controlled emission angle FWHM of less than standard LED dies, such as around 60°. This increased efficiency and collimated output of the µLED 500 can produce light visible to the human eye with only nano-amps of drive current.

The µLED 500 may include an active light emitting area that is less than standard ILEDs, such as less than 2,000 µm². The µLED 500 directionalizes the light output from the active light emitting area and increases the brightness level of the light output. The µLED 500 may be less than 50 µm in diameter with a parabolic structure (or a similar structure) etched directly onto the LED die during the wafer processing steps to form a quasi-collimated light beam emerging from the light emitting face 510.

As used herein, "directionalized light" includes collimated and quasi-collimated light. For example, directionalized light may be light that is emitted from a light generating region of a LED and at least a portion of the emitted light is directed into a beam having a half angle. This may increase the brightness of the LED in the direction of the beam of light.

A µLED 500 may include a circular cross section when cut along a horizontal plane as shown in FIG. 5. A µLED 500 may have a parabolic structure etched directly onto the LED die during the wafer processing steps. The parabolic structure may comprise a light emitting region of the µLED 500 and reflects a portion of the generated light to form the quasi-collimated light beam emitted from the light emitting face 510.

In some embodiments, the non-visible LED 426 has a common light guiding structure and functionality as the visible LEDs. The non-visible LED 426 may differ from the visible LEDs in semiconductor composition. For example, a red visible LED may include a gallium arsenide (GaAs) substrate 502, and an InGaAlAsP epitaxial layer 504. The non-visible LED 426 may also include the GaAs substrate 502 and InGaAlAsP epitaxial layer 504, except with a greater fraction of indium for longer wavelength emission (e.g., infrared). In some embodiments, the µLED 500 includes a Gallium phosphide (GaP) substrate 502 for increased transparency relative to GaAs, such as for red visible LEDs.

With reference to FIG. 4, the pixel layer 404 can have various sub-pixel layouts. The sub-pixel layout can be chosen based on factors such as sub-pixel geometry, or sub-pixel design (e.g., whether a µLED has same-side contacts or opposite side contacts. Various sub-pixel and pixel layouts of the pixel layer are discussed below and shown in FIGS. 6 through 10. The sub-pixels may be arranged to form multiple pixels that can be tessellated to form the pixel layer 404.

Figure 6:
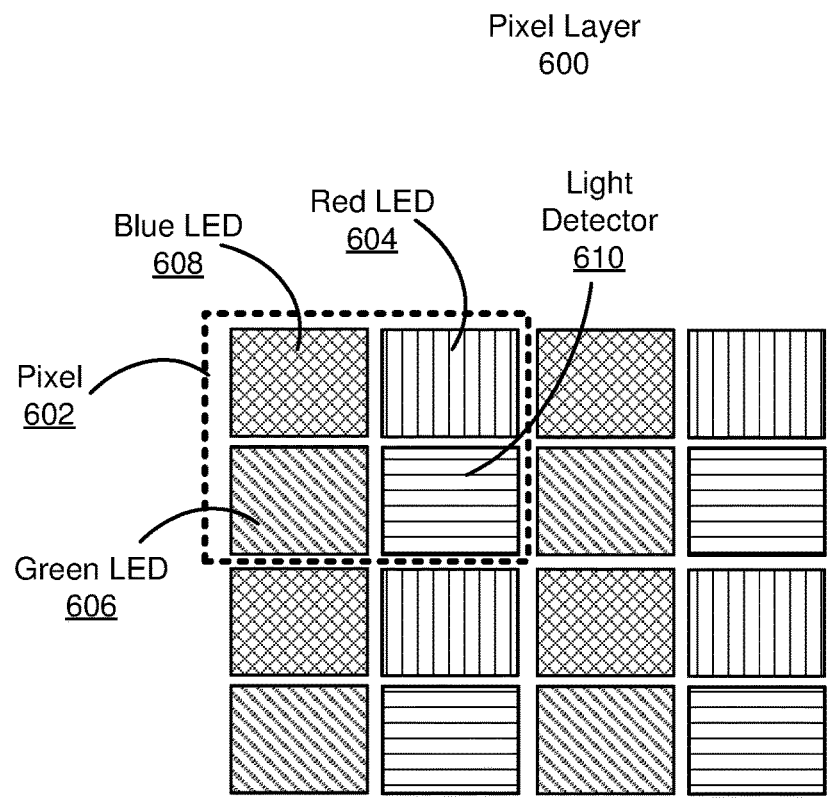
FIGS. 6 through 10 are schematic drawings illustrating arrangement of pixel layers of an electronic display, in accordance with one embodiment.

FIG. 6 shows an arrangement of sub-pixel components in a pixel layer 600, in accordance with one embodiment. The pixel layer 600 includes square pixels 602 arranged adjacently to each other. Each square pixel 602 has square sub-pixels including a red LED 604, a green LED 606, a blue LED 608, and a light detector 610. The color LEDs 604 through 608, as well as other color LEDs discussed herein, are examples of visible LEDs. As discussed above in connection with FIG. 5, the visible LEDs may be µLEDs that emit color collimated light.

The pixels 602 of the pixel layer 600 do not include a non-visible LED. In the embodiment of FIG. 6, one or more non-visible LED, or other type of invisible light emitter, may be located elsewhere in the HMD 105 suitable to emit light on the eyes of the user such that the light is reflected and detected by the light detectors 610 of the pixel layer 600. The collimated beam of visible light emitted from the color LEDs 604 through 608 does not expand into the input regions of adjacent light detectors 610. This prevents the visible light from saturating or otherwise interfering with the capture of non-visibly light by the light detectors 610.

Figure 7:
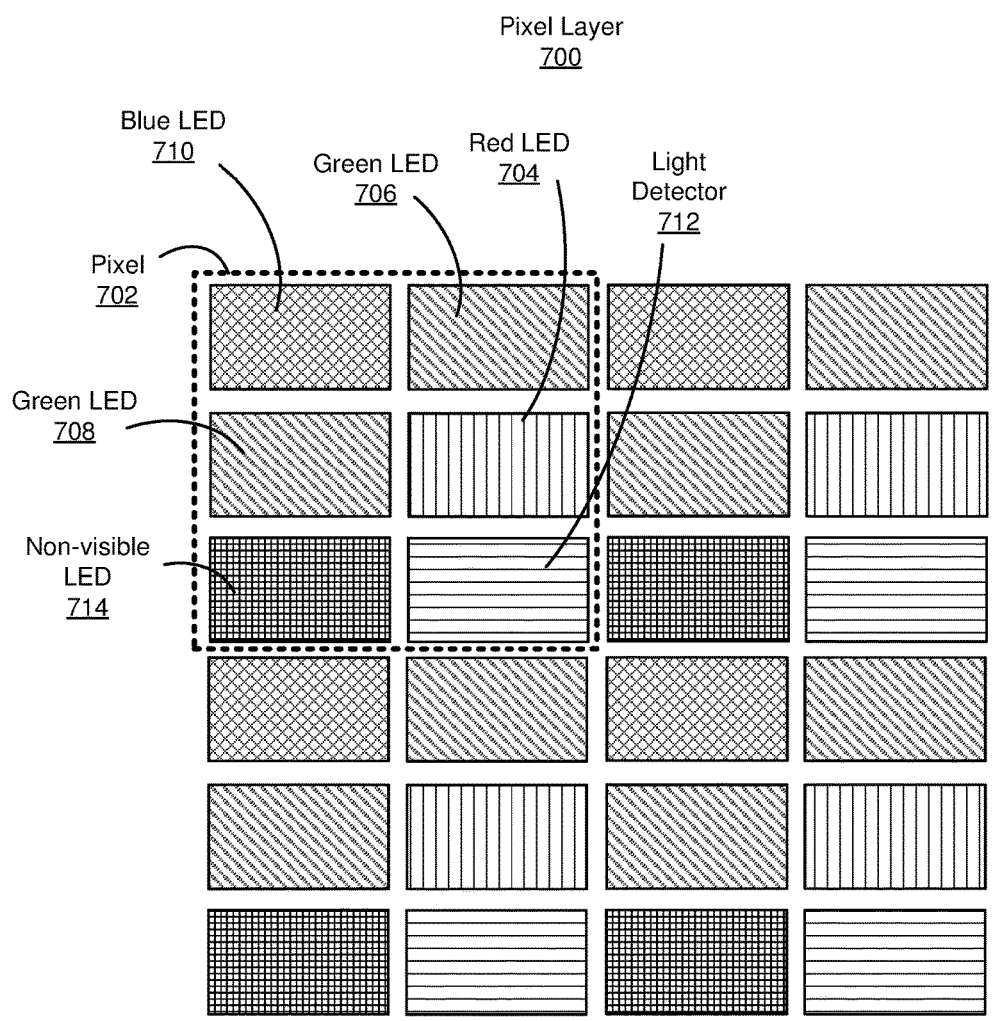

FIG. 7 shows another arrangement of pixel layer 700, in accordance with one embodiment. The pixel layer 700 includes square pixels 702 arranged adjacently to each other. Each square pixel 702 has square sub-pixels including a red LED 704, a first green LED 706, a second green LED 708, a blue LED 710, and a light detector 712, and a non-visible LED 714. The embodiment of FIG. 7 is different from the embodiment of FIG. 6 in that the pixel 702 includes a non-visible LED 714 and an additional green LED. A pixel may include multiple visible LEDs of the same color to achieve suitable output power and color balance.

Figure 8:
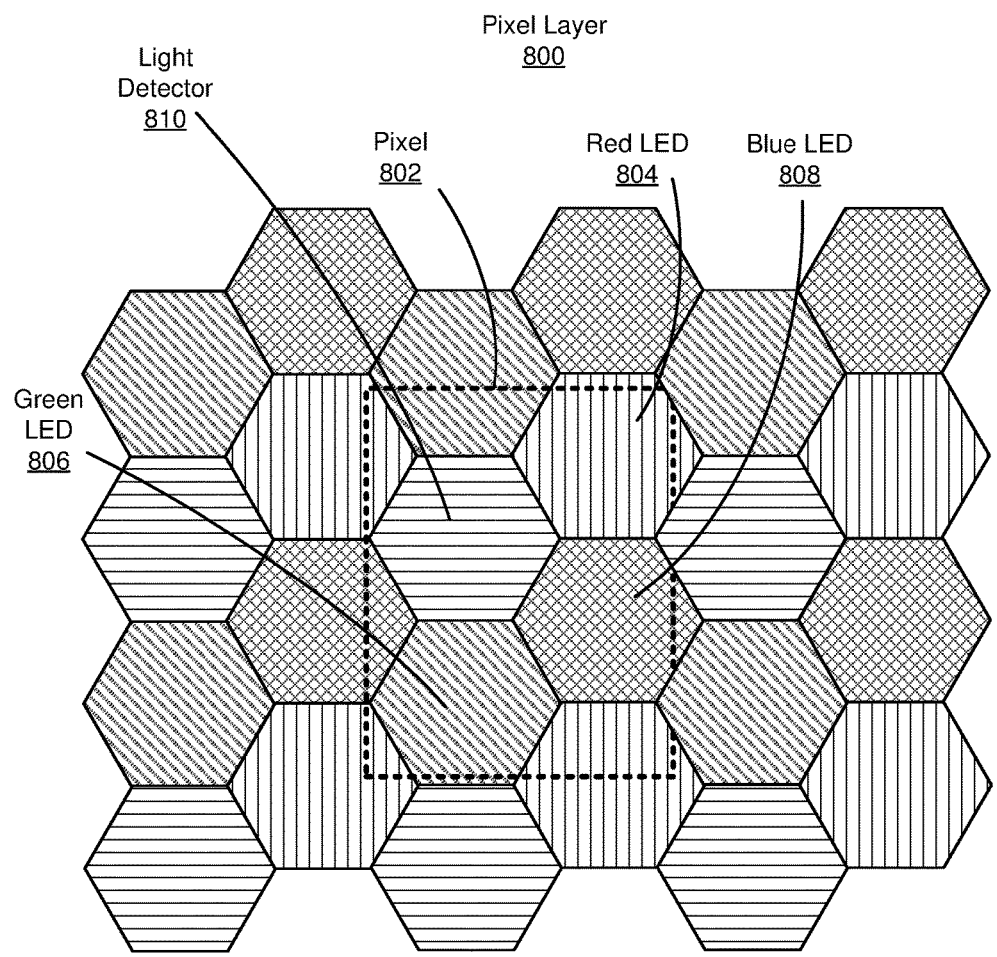

FIG. 8 is a diagram illustrating another arrangement of sub-pixel components in a pixel layer 800, in accordance with one embodiment. The pixel layer 800 includes square pixels 802 arranged adjacently to each other. Each square pixel 802 has hexagonal sub-pixels including a red LED 804, a green LED 806, a blue LED 808, and a light detector 810. The embodiment of FIG. 8 is different from the embodiment of FIG. 6 because hexagonal shaped sub-pixels are used to form the square pixel 802.

Figure 9:
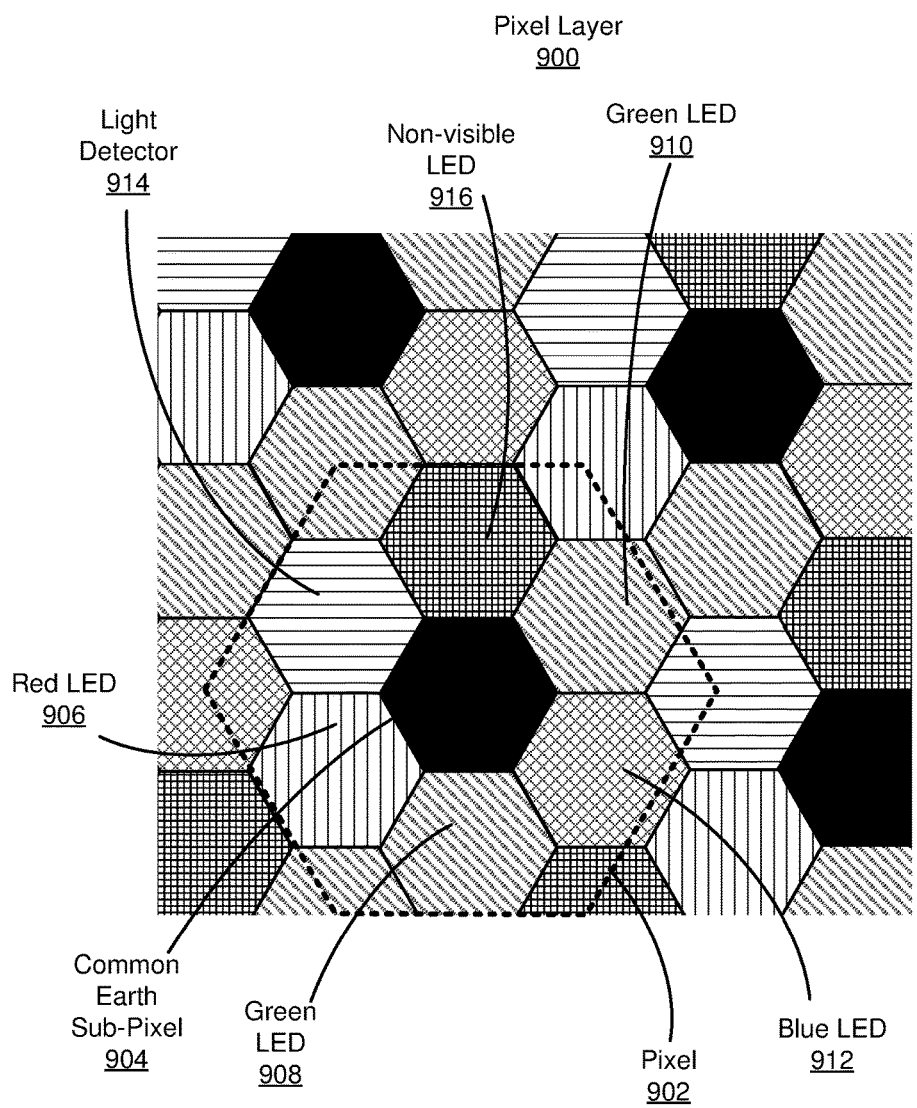

FIG. 9 is a diagram illustrating another arrangement of sub-pixel components in a pixel layer 900, in accordance with one embodiment. The pixel layer 900 includes hexagonal pixels 902 arranged adjacently to each other. Each hexagonal pixel 902 has hexagonal sub-pixels including a common earth sub-pixel 904, a red LED 906, a first green LED 908, a second green LED 910, a blue LED 912, and a light detector 914, and a non-visible LED 916. The embodiment of FIG. 9 is different from the embodiment of FIG. 8 in that pixel 902 includes the common earth sub-pixel 904, the non-visible LED 916, and an additional green LED.

When the n-contact and p-contact of the sub-pixel components are on the same side of the component (e.g., the side facing the substrate 402), the common earth sub-pixel 904 defines a space in the tessellating pattern for the n-contacts of surrounding sub-pixel components. When the n-contact is on the opposite side of the sub-pixel component, the light emitting face of the sub-pixel component may include a transparent contact, for example ITO or conductive polymer. Placing the p-contact on the opposite side of the sub-pixel component to the n-contact may allow for smaller pixels because space is not needed for the n-contact and the p-contact on the substrate 402.

Figure 10:
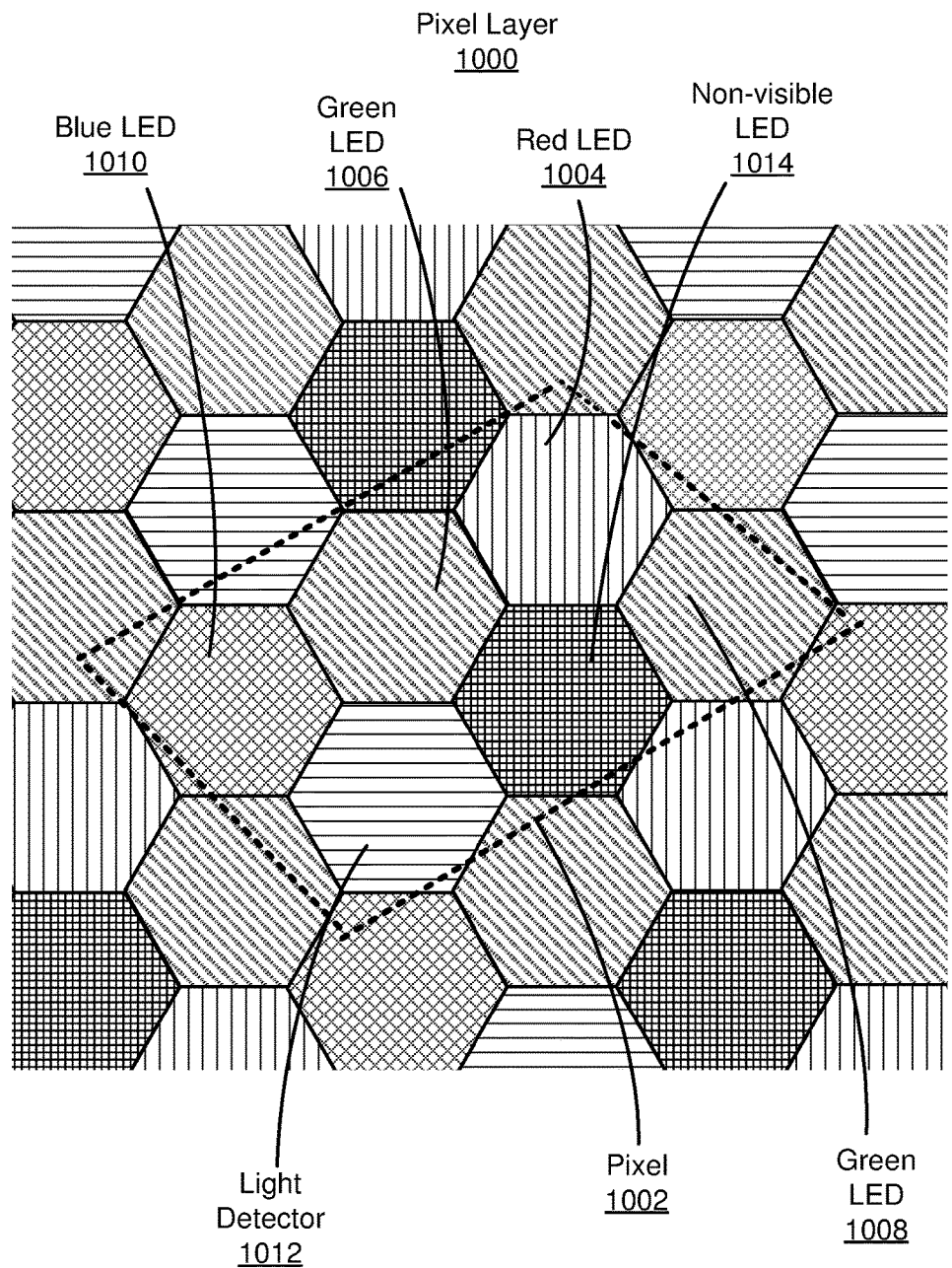

FIG. 10 is a diagram illustrating another arrangement of sub-pixel components in a pixel layer 1000, in accordance with one embodiment. The pixel layer 1000 includes quadrilateral pixels 1002 arranged adjacently to each other. Each quadrilateral pixel 1002 has hexagonal sub-pixels including a red LED 1004, a first green LED 1006, a second green LED 1008, a blue LED 1010, and a light detector 1012, and a non-visible LED 1014. The quadrilateral pixel 1002 has a 30 degree offset quadrilateral shape that stacks in a rectangular addressable grid. The embodiment of FIG. 10 is different from the embodiment of FIG. 9 in that the pixel 1002 does not include the common earth sub-pixel, and has a different pixel shape.

The pixel layer 1000 is an example of a densely packed arrangement of sub-pixel components. The n-contact and p-contact of the sub-pixel components are on opposite sides of the sub-pixel components, with the p-contact facing the display substrate 402. Thus, the tessellation pattern of each pixel 1002 does not need to accommodate space for both n-contacts and p-contacts. When the common earth sub-pixel is not needed for connecting contacts, the pixel size can be reduced using a more densely packed arrangement of the pixel layer.

FIG. 11 shows a display panel 1100, in accordance with one embodiment. The electronic display 1100 is an example of an electronic display 155 that can be incorporated in an HMD 105. The display panel 1100 includes a pixel layer 1102 and a light detector layer 1106 positioned behind the pixel layer 1102 (from the perspective of the viewer). The pixel layer 1102 includes pixels 1104 having sub-pixels of visible LEDs. For example, the pixel 1104 includes a blue LED, two green LEDs, and a red LED. One or more non-visible LEDs or other invisible light emitter can be located elsewhere as discussed herein. In some embodiments, some or all of the pixels in the pixel layer 1102 may include a non-visible LED.

The light detector layer 1106 includes an array of light detectors 1108. The light detector layer 1106 may include a lower resolution of light detectors 1108 than the resolution of sub-pixels of the pixel layer 1102. The pixel layer 1102 is a transparent or partially transparent to allow invisible light propagation through the pixel layer 1102 to the light detectors 1108.

In some embodiments, the pixels 1104 of the pixel layer 1102 are positioned on a first side of a transparent display substrate 402, and the light detector layer 1106 is positioned on the other side of the display substrate 402. The display substrate 402 provides electrical connections for controlling the pixel layer 1102 and the light detector layer 1106. In other embodiments, the light detector layer 1106 is positioned on and electrically connected with a separate substrate. The substrate is located behind the light detector layer 1106, and may be transparent or opaque. In some embodiments, a light detector layer 1106 is incorporated onto the surface of a backplane driver chip that drives the display panel. The light detector layer 1106 and backplane driver chip collectively form the display substrate 402 on which other sub-pixel components are placed.

In one embodiment, the resolution of light detectors within the pixels on the pixel layer is lower than the resolution of visible LEDs. Put another way, only a portion of the pixels may include a light detector. For example, the density of light detectors within the pixels in a center region is higher than the density of light detectors in a periphery region outside of the center region. Every pixel in the center region may include a light detector, while only some of the pixels in the periphery region include a light detector (e.g., every other pixel, every n pixels, etc.). The pixels that are more likely to be viewed (e.g., toward the center region of the display panel) may include a light detector while pixels that are less likely to be viewed (e.g., toward the periphery region of the display panel) do not include a light detector. The density of light detector sub-pixels positioned on the display substrate may decrease from the center of the display panel to toward the peripheries of the display panel.

A process for controlling an electronic display for concurrent video output and eye position tracking, in accordance with one embodiment, is described. The process is discussed as being performed by the electronic display 155, such as by the controller 408 to coordinate operation of the display panel 400. Other types of circuitry may be used in various other embodiments to perform the process.

The controller 408 causes visible LEDs and non-visible LEDs of the electronic display 155 to concurrently emit visible and invisible light. For example, the controller 408 may be connected with the LEDs via panel drivers. The controller 408 generates and sends the LED control signal 412 to electronic display 155 to cause the visible LEDs to emit visible light 430 for displaying video data. The video data may include sequences of video frames. The controller 408 also generates and sends the light emitter controller signal 414 to the electronic display 155 to cause the non-visible LEDs 426 to emit invisible light. The controller 408 controls the timing and content of the signals 412 and 414 to coordinate the concurrent emission of the visible light 430 and the invisible light 432.

The visible light 430 and invisible light 432 are emitted from the visible LED and non-visible LED sub-pixel components of the electronic display 155 in a first direction toward the eye of the viewer, or toward an optics block 165 positioned between the eye and the electronic display 155. The invisible light 432 is reflected from the eye of the viewer and propagates back toward the electronic display 155 in a second direction opposite the first direction as invisible light 434 for capture by a light detector 428.

In some embodiments, the emission of light from the visible LEDs and non-visible LEDs are not concurrent. The light detector 428 may be activated, for example, when the non-visible LEDs are emitting invisible light 432 but not when the visible LEDs are emitting visible light 430. By separating the emission of the visible light 430 and the invisible light 432 in time, the accuracy of the light detector 428 may be improved by the reduced likelihood of optical interference caused by the light detector 428 capturing the visible light 430.

In some embodiments, the controller 408 causes only subsets of the non-visible LEDs 426 to concurrently emit light. This might be done to suppress unwanted backscatter.

In this way, the information captured by the light detectors 428 can be deterministically controlled for processing.

The controller 408 causes one or more light detectors 428 of the electronic display 155 to capture the invisible light 434 and generate image data based on the captured invisible light. The invisible light 434 propagates from the non-visible LEDs 426 at the surface 418 of the substrate 402 toward the eyes of the viewer of the electronic display 155, and reflects from the eyes toward the light detectors 428 (as shown by the invisible light 434). Different features of on the eye, such as the pupil, sclera, or reflective glints, reflect and absorb portions of incident differently, resulting in different pixel values of the image data. A light detector 428 may be configured to generate image data defining the image of the eye using the captured invisible light.

The controller 408 generates eye tracking information from the image data generated by the light detectors 428. The controller 408 tracks movements of the eyes of the user based on captured invisible light. For example, the controller 408 generates eye tracking information based on an analysis of the image defined by the image data. The controller 408 may use pixel value thresholds to identify eye features of interest, and compare the locations of identified eye features over time and/or in relation to other eye features to determine the eye tracking information. The eye tracking information may include data defining the position, orientation, gaze direction/location, vergence depth, or accommodation state of the viewer's eyes (e.g., the accommodation plane). In some embodiments, the controller 408 uses the image data generated by the light detectors 428 to directly (e.g., without calculating eye location) generate information about the accommodation state of the eyes, such as by determining how the invisible light is altered as it enters the eyes.

In some embodiments, the controller 408 transmits images generated by the light detector 428 to a separate processing circuitry, such as the console 120). The controller 408 may be located in the HMD 105 which is separate from the console 120. The console 120 determines the eye tracking information based on the image.

The controller 408 or a separate processing circuitry (e.g., console 120) generates gaze contingent content based on the eye tracking information. Gaze contingent content may include video data that is generated based on the determined position of the user's eyes. In some embodiments, the console 110 receives the eye tracking information from the controller 408, and renders scenes based on the eye tracking information. The rendering may include dynamically changing a distortion model based on where the user is looking, or changing the pixel resolutions at different locations of the display. For example, a higher resolution rendering may be used for display pixels at or near the focus location of the user, while lower resolution rendering may be used for display pixels at the periphery of the user's field of view, or outside of the user's field of view. In another example, objects within gaze contingent content at the vergence depth of the user's eyes may be rendered with higher resolution than objects at different depths within a scene. In yet another example, the focal plane of the eyes of the viewer is adjusted by adjusting the relative position of optics block 165 to the electronic display 155 and the exit pupil 250. The focal plane may be adjusted to match the accommodation plane of the viewer's eyes as determined from the eye tracking information. In some embodiments, display pixels outside the user's view are not rendered, or illuminated, etc. The console 110 may be configured to calculate the user's field of view based on the positions and vergence depth of the eyes. The creation of gaze contingent content based on eye tracking information as discussed herein enhances the immersive visual experience of HMDs. The concurrent eye tracking and gaze contingent content rendering discussed herein reduces the latency between the capture of eye position information and the rendering of corresponding gaze contingent content, and improves real-time performance of the HMD.

The process may return to a prior step, where the controller 408 controls the visible LEDs and non-visible LEDs of the electronic display 155 to concurrently emit visible and invisible light for a subsequent video frame. The light control signal 412 includes video data for the gaze contingent content generated based eye tracking information derived from the invisible light previously captured by the light detector 428. Concurrent with the display of this gaze contingent content, the controller 408 provides the light emitter control signal 414 to control the non-visible LED 426 to emit invisible light to facilitate creation of eye tracking information for a further subsequent video frame of gaze contingent content.

The arrangement and features of the sub-pixel components provides for the concurrent emission of visible light with the emission and capturing of invisible light without interference. The collimated light 430 emitted from each visible LED results in a reduction of visible light beam width spread into the beam path of the nonvisible light 432 and 434. If the visible LEDs do not collimate the light outputs, then visible light could saturate the light detector 428 or otherwise interfere with the beam path of the invisible light. The controller may be configured drive the visible and non-visible LEDs in separate time periods to ensure lack of light interference and reliable invisible light capture. However, such an approach results in increased latency between eye tracking data detection and the corresponding gaze contingent content being output on the display. The latency is reduced when the electronic display outputs gaze contingent content and tracks eye movements concurrently as discussed herein.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A display panel, comprising:
a substrate;
a plurality of visible light emitting diodes (LEDs) positioned on a side of the substrate, each of the visible LEDs configured to transmit quasi-collimated visible light propagating away from the side of the substrate;
a plurality of non-visible LEDs positioned on the side of the substrate and configured to emit invisible light propagating away from the side of the substrate; and
a plurality of light detectors positioned on the side of the substrate configured to capture the invisible light propagating towards the side of the substrate, wherein the plurality of visible LEDS, a light detector of the plurality of light detectors, and a non-visible LED of the plurality of non-visible LEDs form a pixel on the substrate around a hexagonal region of the substrate; and wherein:

the plurality of visible LEDs, the light detector, and the non-visible LED each include a p-contact and an n-contact coupled to the substrate; and the plurality of visible LEDs, the light detector, and the non-visible LED surround a common earth sub-pixel defining the hexagonal region of the pixel including the n-contact of the plurality of visible LEDs, the light detector, and the non-visible LED.

2. The display panel of claim 1, wherein each of the visible LEDs comprises an active layer for generating the visible light and an epitaxial layer shaped into a mesa to reflect and collimate a portion of the visible light.

3. The display panel of claim 1, wherein the plurality of visible LEDs comprise a red LED for emitting red light, a plurality of green LEDs for emitting green light, and a blue LED for emitting blue light.

4. The display panel of claim 1, wherein the plurality of visible LEDs comprise a red LED for emitting red light, a green LED for emitting green light, and a blue LED for emitting blue light.

5. The display panel of claim 4, wherein the light detector of the pixel and a visible LED of the plurality of visible LEDs of the pixel are positioned adjacent to each other on the side of the substrate.

6. The display panel of claim 1, wherein each of the plurality of visible LEDs, each of the plurality of non-visible LEDs, and each of the plurality of the light detectors has a hexagonal shape.

7. The display panel of claim 1, wherein the plurality of non-visible LEDs are infrared LEDs and the invisible light is infrared light.

8. The display panel of claim 1, wherein the plurality of visible LEDs emit the visible light and the plurality of non-visible LEDs emit the invisible light concurrently.

9. The display panel of claim 1, wherein a first density of the plurality of light detectors in a center region of the substrate is higher than a second density of the plurality of light detectors in a periphery region of the substrate.

10. A method, comprising:
emitting, by a plurality of visible light emitting diodes (LEDs) positioned on a side of a substrate of a display panel, quasi-collimated visible light in a first direction away from the side of the substrate;
emitting, by a plurality of non-visible LEDs positioned on the side of the substrate, invisible light in a first direction away from the side of the substrate, the invisible light emitted with the emission of the quasi-collimated visible light by the plurality of visible light LEDs;
capturing, by a plurality of light detectors, a portion of the invisible light reflected from eyes of a user and propagating in a second direction toward the plurality of light detectors on the side of the substrate; and
determining an accommodation state of the eyes of the user based on the captured invisible light; wherein the plurality of visible LEDS, a light detector of the plurality of light detectors, and a non-visible LED of the plurality of non-visible LEDs form a pixel on the substrate around a hexagonal region of the substrate, and wherein:

the plurality of visible LEDs, the light detector, and the non-visible LED each include a p-contact and an n-contact coupled to the substrate; and the plurality of visible LEDs, the light detector, and the non-visible LED surround a common earth sub-pixel defining the hexagonal region of the pixel including the n-contact of the plurality of visible LEDs, the light detector, and the non-visible LED.

11. The method of claim 10, further comprising:
rendering gaze contingent content based on the accommodation state of the eyes; and
emitting second quasi-collimated visible light from the plurality of visible LEDs to output the gaze contingent content.

12. The method of claim 10, wherein the plurality of visible LEDs comprise a red LED for emitting red light, a plurality of green LEDs for emitting green light, and a blue LED for emitting blue light.

13. The method of claim 10, wherein the light detector of the plurality of light detectors is positioned adjacent to a visible LED of the plurality of visible LEDs on the side of the substrate.

14. The method of claim 10, wherein the plurality of non-visible LEDs are infrared LEDs and the invisible light is infrared light.

15. The method of claim 10, wherein the plurality of visible LEDs include a red LED, a green LED, and a blue LED.

16. The method of claim 10, wherein the light detector is positioned adjacent to a visible LED of the plurality of visible LEDs on the side of the substrate.

17. A head-mounted display (HMD), comprising:
a display panel including:
a substrate;
a plurality of visible light emitting diodes (LEDs) positioned on a side of the substrate, each of the visible LEDs configured to transmit quasi-collimated visible light propagating away from the side of the substrate;
a plurality of non-visible LEDs positioned on the side of the substrate and configured to emit invisible light propagating away from the side of the substrate; and
a plurality of light detectors positioned on the side of the substrate configured to capture the invisible light propagating towards the side of the substrate, wherein the plurality of visible LEDS, a light detector of the plurality of light detectors, and a non-visible LED of the plurality of non-visible LEDs form a pixel on the substrate around a hexagonal region of the substrate; and wherein:

the plurality of visible LEDs, the light detector, and the non-visible LED each include a p-contact and an n-contact coupled to the substrate; and the plurality of visible LEDs, the light detector, and the non-visible LED surround a common earth sub-pixel defining the hexagonal region of the pixel including the n-contact of the plurality of visible LEDs, the light detector, and the non-visible LED.

18. The HMD of claim 17, wherein the plurality of visible LEDs include a red LED, a green LED, and a blue LED.

19. The HMD of claim 17, wherein the light detector is positioned adjacent to a visible LED of the plurality of visible LEDs on the side of the substrate.

* * * * *